US007012807B2

(12) United States Patent
Chu et al.

(10) Patent No.: US 7,012,807 B2
(45) Date of Patent: Mar. 14, 2006

(54) THERMAL DISSIPATION ASSEMBLY AND FABRICATION METHOD FOR ELECTRONICS DRAWER OF A MULTIPLE-DRAWER ELECTRONICS RACK

(75) Inventors: Richard C. Chu, Hopewell Junction, NY (US); Michael J. Ellsworth, Jr., Lagrangeville, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 10/675,628

(22) Filed: Sep. 30, 2003

(65) Prior Publication Data

US 2005/0068728 A1    Mar. 31, 2005

(51) Int. Cl.
   *H05K 7/20*   (2006.01)
(52) U.S. Cl. ............... 361/699; 361/704; 361/727; 165/80.4; 165/104.33
(58) Field of Classification Search ........ 361/679–727, 361/690; 165/104.33, 80.4; 174/15.1
See application file for complete search history.

(56) References Cited

U.S. PATENT DOCUMENTS

| 6,055,157 | A | 4/2000 | Bartilson ............... 361/699 |
| 6,388,882 | B1 | 5/2002 | Hoover et al. ........... 361/704 |
| 6,411,512 | B1 | 6/2002 | Mankaruse et al. ...... 361/700 |
| 6,536,510 | B1 | 3/2003 | Khrustalev et al. ..... 165/104.33 |
| 6,657,121 | B1 * | 12/2003 | Garner .................. 174/16.3 |
| 6,796,372 | B1 * | 9/2004 | Bear .................... 165/104.21 |
| 6,836,407 | B1 * | 12/2004 | Faneuf et al. ........... 361/687 |
| 2002/0114139 | A1 * | 8/2002 | Bash et al. .............. 361/719 |
| 2004/0150949 | A1 * | 8/2004 | Belady et al. ........... 361/687 |
| 2005/0041391 | A1 * | 2/2005 | Wrycraft et al. ......... 361/695 |

FOREIGN PATENT DOCUMENTS

JP            6-260784         9/1994

OTHER PUBLICATIONS

"Removable Modular Power Supply With Heat Pipes Interconnecting a Horizontally Disposed Base and a Vertically Disposed Attachment to a Cold Plate," IBM Technical Disclosure Bulletin, Dec. 1985, page one.
"Dockable Server Concepts", Intel Developer Forum, Feb. 25, 2002, pp. 1-40.

* cited by examiner

*Primary Examiner*—Anatoly Vortman
*Assistant Examiner*—Zachary M. Pape
(74) *Attorney, Agent, or Firm*—Lily Neff, Esq.; Kevin P. Radigan, Esq.; Heslin Rothenberg Farley & Mesiti, P.C.

(57) ABSTRACT

A thermal dissipation assembly and method, and a cooled multi-drawer electronics rack are provided having a first cooling loop and a second cooling loop. The first cooling loop is disposed substantially within an electronics drawer and positioned to extract heat from an electronics module within the drawer. The first cooling loop further includes a first planar heat transfer surface. The second cooling loop is disposed substantially external to the electronics drawer and includes a second planar heat transfer surface. A biasing mechanism mechanically forces the first planar heat transfer surface and the second heat transfer surface coplanar when the electronics drawer is in a docked position in the electronics rack to facilitate the transfer of heat from the first cooling loop to the second cooling loop.

13 Claims, 6 Drawing Sheets

THERMAL DISSIPATION ASSEMBLY AND FABRICATION METHOD FOR ELECTRONICS DRAWER OF A MULTIPLE-DRAWER ELECTRONICS RACK

TECHNICAL FIELD

The present invention is directed to cooling assemblies and other apparatus used for removing heat from electronic devices and modules. More particularly, this invention relates to an enhanced thermal dissipation assembly and fabrication method for extracting heat from a heat generating component disposed within an electronics drawer of a multi-drawer electronics rack.

BACKGROUND OF THE INVENTION

As is well known, as the circuit density of electronic chip devices increases in order to achieve faster and faster processing speed, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause of failure of chip devices. Furthermore, it is anticipated that demand for heat removal from these devices will increase indefinitely. Accordingly, it is seen that there is a large and significant need to provide useful cooling mechanisms for electronic circuit devices.

Each new generation of computers continues to offer increased speed and function. In most cases, this has been accomplished by a combination of increased power dissipation and increased packaging density. The net result has been increased heat flux at all levels of packaging. For example, a common packaging configuration for many large computer systems today is a multi-drawer rack, with each drawer containing one or more processor modules along with associated electronics, such as memory, power and hard drive devices. These drawers are removable units so that in the event of failure of an individual drawer, the drawer may be removed and replaced in the field. The problem with this configuration is that the increase in heat flux at the electronics drawer level makes it increasingly difficult to dissipate heat by simple air cooling.

SUMMARY OF THE INVENTION

The needs of the prior art are addressed, and additional advantages are provided, by the present invention which in one aspect is a thermal dissipation assembly which includes a first liquid cooling subsystem and a second liquid cooling subsystem. The first liquid cooling subsystem is disposed within an electronics drawer and positioned to extract heat from a heat generating component within the electronics drawer. A biasing mechanism is provided for mechanically forcing a first planar heat transfer surface of the first liquid cooling subsystem and a second planar heat transfer surface of the second liquid cooling subsystem coplanar when the electronics drawer is in a docked position to facilitate the transfer of heat from the first liquid cooling subsystem to the second liquid cooling subsystem.

Methods for fabricating a thermal dissipation assembly for an electronics drawer of an electronics rack, and methods of cooling a multi-drawer electronics rack are also described and claimed.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, "electronics drawer" comprises any receptacle, compartment, node, book, etc., containing one or more heat generating components of a computer system or other electronics system requiring cooling. The term "electronics module" includes any heat generating component of a computer system or electronics system and may be, for example, one or more integrated circuit devices, or one or more packaged electronics devices (such as a processor module).

Figure 1:
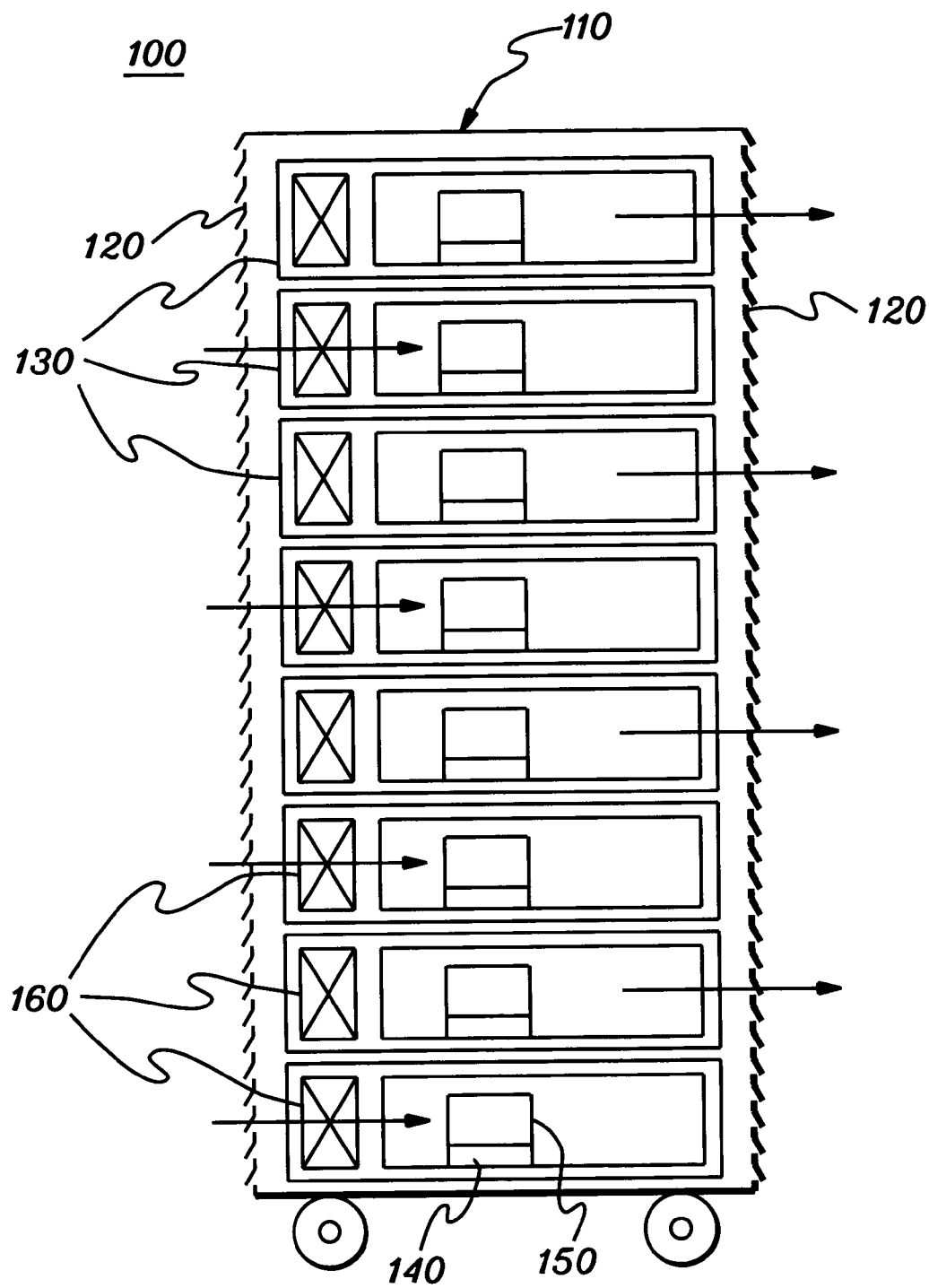
FIG. 1 depicts one embodiment of a conventional air-cooled multi-drawer electronics rack.

FIG. 1 depicts one embodiment of a conventional multi-drawer electronics rack, generally denoted 100. Rack 100 includes a frame or housing 110 having ventilated covers 120 over multiple sides thereof to allow for flow of air through the housing. Rack 100 also includes a plurality of electronics drawers 130, one or more of which are removable so that the electronics drawer can be readily replaced in the event of failure.

Multi-drawer electronics rack 100 is conventionally cooled by forced air flow, for example, produced by fans 160 in the individual electronics drawers as shown in FIG. 1. Air cooled heat sinks 150 are used to dissipate heat from the high power components, such as electronics modules 140 in the drawers.

Figure 2:
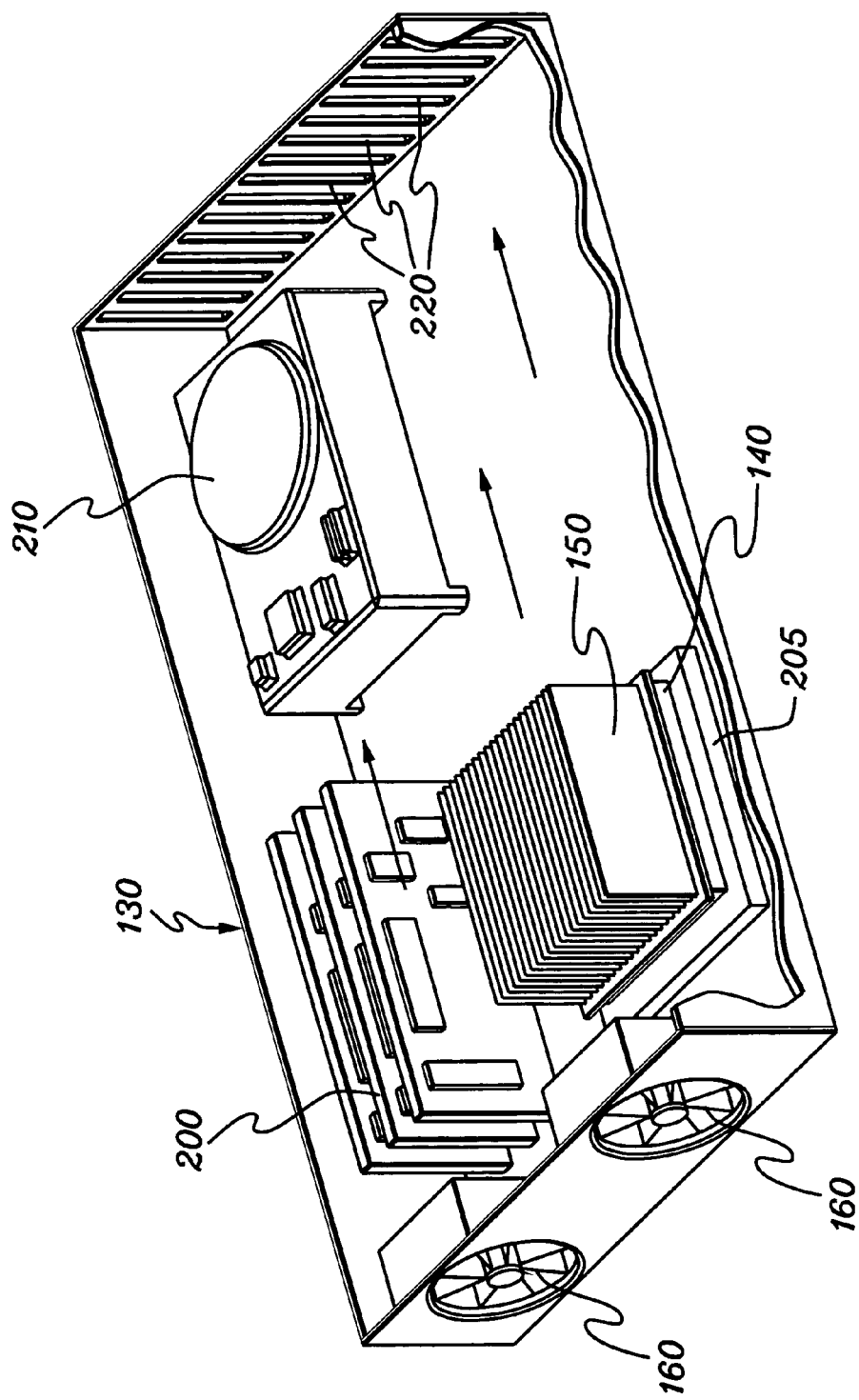
FIG. 2 is a partially cut away, perspective view of one embodiment of a conventional electronics drawer for the multi-drawer electronics rack of FIG. 1.

FIG. 2 depicts a partially cut away, perspective view of a conventional electronics drawer 130. In this figure, the air cooled heat sink 150 is shown to comprise a plurality of fins which extend upward from a base surface mechanically coupled to electronics module 140. Module 140 is mounted on a module socket 205. Fans 160 direct air flow through the air cooled heat sink 150 from one side of electronics drawer 130 to air exhaust events 220 on an opposite side of the drawer. Electronics drawer 130 is also shown to include electronics cards 200 and a hard drive 210, i.e., in this embodiment. As noted above, as circuit density and power dissipation of integrated circuit chips continues to increase, it is becoming increasingly difficult to remove heat by simple passive or forced air cooling and still maintain reasonable chip temperature for circuit performance and reliability.

One possible solution to this problem would be to attach water cooled cold plates to the electronics modules within the electronics drawer(s) and provide hoses to bring water into and out of each electronics drawer. Although this solution is capable of providing the required cooling capability, it would be undesirable and impractical in respect to opening/removing the electronics drawer. This solution would require extra hose lines to accommodate the drawer travel. The extra hose lengths would be difficult to stow away when the drawer is in a docked position. If a drawer has to be removed, the connections would have to be broken raising the risk of accidental coolant spills on the electronics and would probably necessitate the use of quick disconnects on the hoses, with their added pressure drops.

Figure 3:
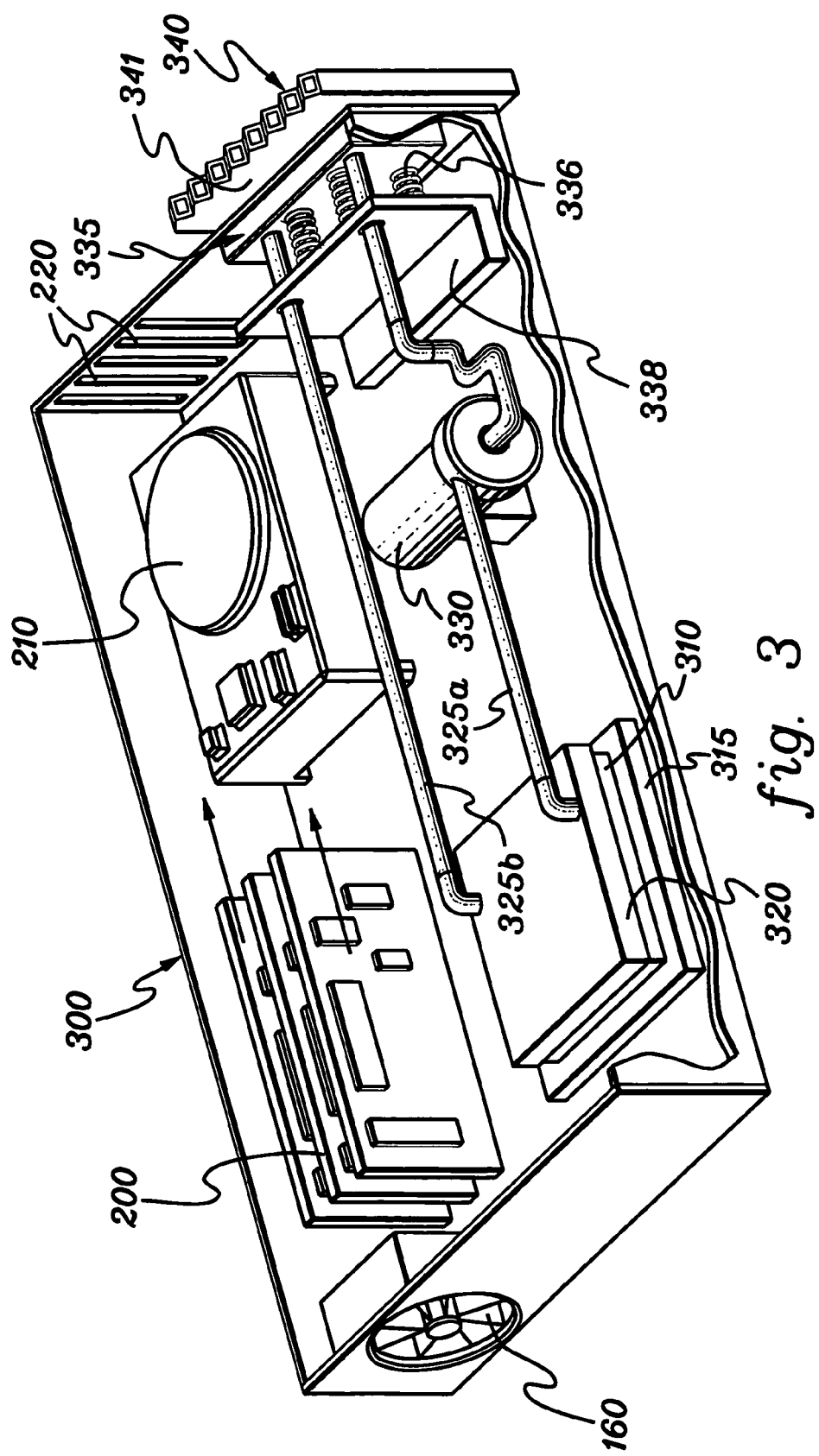
FIG. 3 is a partially cut away, perspective view of one embodiment of an electronics drawer with a thermal dissipation assembly, in accordance with an aspect of the present invention.

An alternative and enhanced solution to the problem is depicted in FIG. 3, which shows one embodiment of a thermal dissipation assembly in accordance with an aspect to the present invention. Generally stated, this thermal dissipation assembly includes a first liquid cooling loop disposed within the electronics drawer 300 to provide the advantages of liquid cooling (e.g., water cooling) via a modular cold plate attached to the electronics module, without the necessity of coolant lines leaving the drawer. Instead, coolant is circulated by active or passive means within the electronics drawer through a heat rejection cold plate. Through an opening in the back of the electronics drawer, the heat rejection cold plate is made to contact a system cold plate in a secondary or system liquid cooling loop, carrying (for example) cooling water supplied by external means such as a coolant distribution unit (CDU) or a utility water cooling supply.

A biasing mechanism is used to provide a mechanical force required to achieve good thermal contact between the heat rejection cold plate and the system cold plate. In particular, a first main planar surface of the heat rejection cold plate functions as a first planar heat transfer surface and a second main planar surface of the system cold plate functions as a second planar heat transfer surface, and when the electronics drawer is docked in the multi-drawer electronics rack, the biasing mechanism applies a perpendicular force to at least one of the first and second planar heat transfer surfaces in order to force the surfaces coplanar and thereby facilitate efficient transfer of heat from the first liquid cooling loop to the second liquid cooling loop. This approach also allows the electronics drawer to be opened and removed without breaking or disconnecting any coolant lines.

Referring more particularly to FIG. 3, one embodiment of an electronics drawer 300 in accordance with aspect to the present invention is depicted. In this embodiment, an enhanced thermal dissipation assembly is provided which includes a first cooling loop disposed substantially internal to the electronics drawer and a second cooling loop disposed external to the drawer. This thermal dissipation assembly can be characterized as an elastically coupled cold plate cooling system with an active primary cooling ioop within the drawer (i.e., the first cooling loop). This first cooling loop includes the module cold plate 320 mechanically coupled to a processor module 310 which resides in a module socket 315. A pump 330 circulates coolant, such as water, through elastic cooling lines 325a, 325b between module cold plate 320 and heat rejection cold plate 335 (referred to as a "first fluid cold plate" in the appended claims). A system cold plate 340 (referred to as a "second fluid cold plate" in the appended claims) is cooled by an external water supply (not shown) and is mounted opposite the backside of the electronics drawer. The heat rejection cold plate 335 is allowed to project a small distance (e.g., 0.1 to 0.2 inches) out an opening in the back of the drawer, and is attached to biasing springs 336, which in turn are attached to an L-shaped pressure plate 338 fixedly mounted to the drawer chassis. Pressure plate 338 is positioned so that when the electronics drawer is slid horizontally into a docked position (see FIG. 4A), springs 336 are compressed forcing the heat rejection cold plate 335 into good thermal contact with the system cold plate 340 with a planar main surface 334 (see FIG. 4A) of cold plate 335 (i.e., a first planar heat transfer surface) and a planar main surface 341 of system cold plate 340 (i.e., a second planar heat transfer surface) forced coplanar or physically engaging to facilitate the transfer of heat from the first liquid cooling subsystem to the second liquid cooling subsystem.

The electronics drawer 300 of FIG. 3 is also shown to include a fan 160 for generating air flow across electronics cards 200 and a hard drive 210, with the air being exhausted through air exhaust vents 220.

Figure 4A:
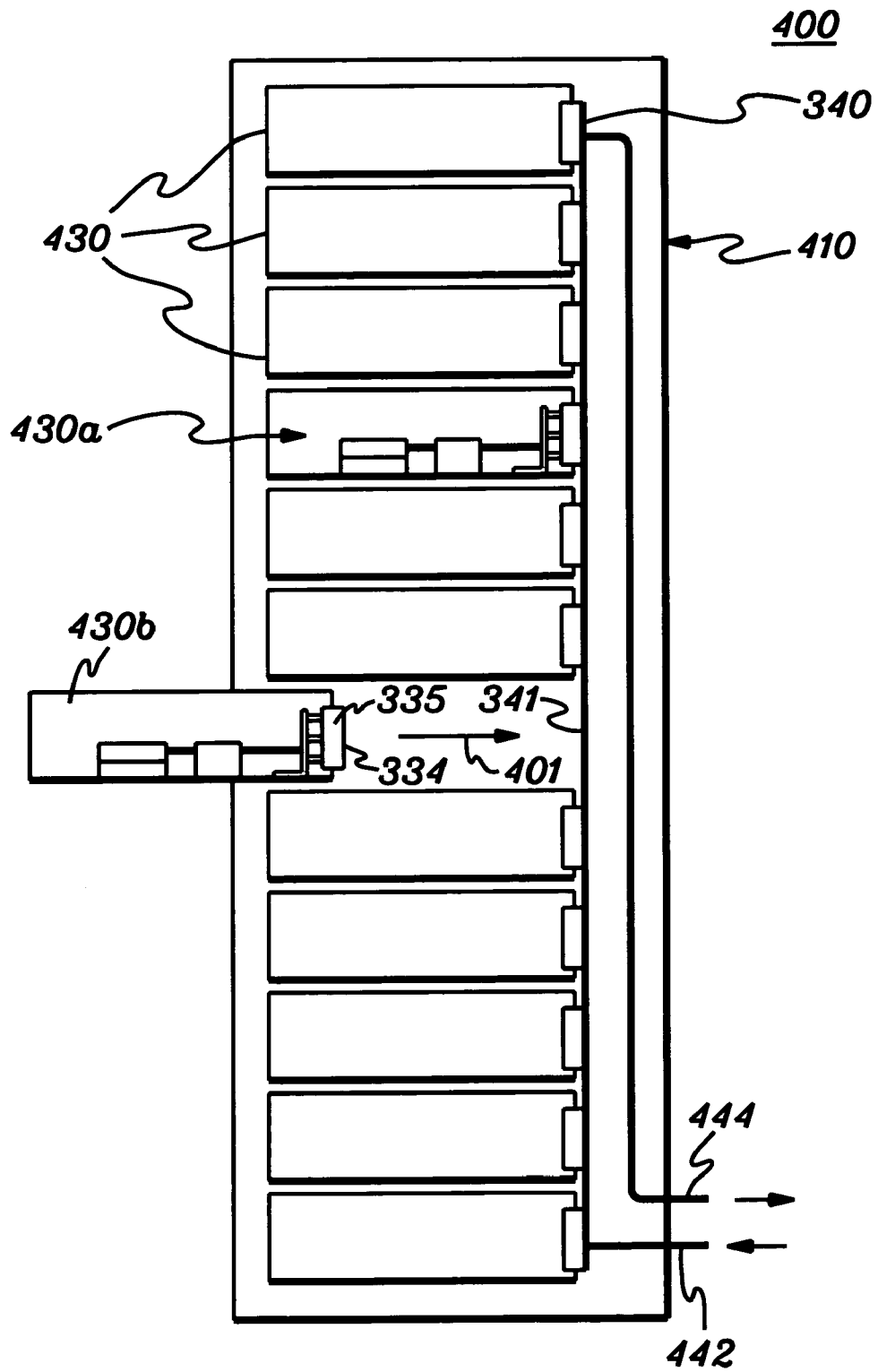
FIG. 4A is a side elevational view of one embodiment of a cooled multi-drawer electronics rack employing thermal dissipation assemblies, in accordance with an aspect of the present invention.
Figure 4B:
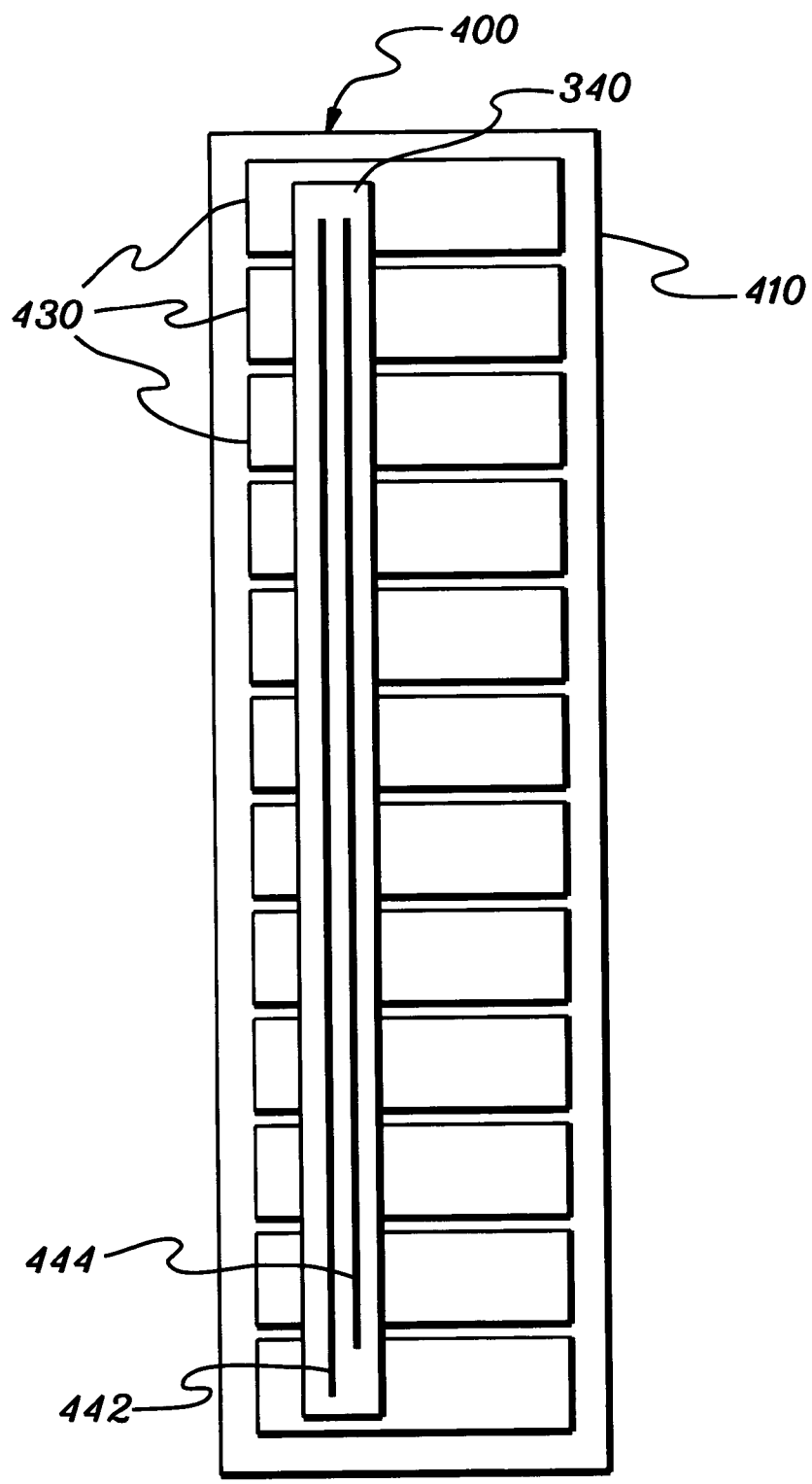
FIG. 4B is a back elevational view of the cooled multi-drawer electronics rack embodiment of FIG. 4A, in accordance with an aspect of the presentation.

FIGS. 4A and 4B depict one embodiment of a cooled multi-drawer electronics rack, generally denoted 400, in accordance with an aspect of the present invention. This electronics rack has a plurality of electronics drawers 430, all of which are shown docked within the chassis of the electronics rack except for drawer 430b which is shown open or undocked (for example, for servicing). Each drawer slides in a horizontal sliding direction 401 into a docked position, and in the docked position biasing springs 336 (FIG. 3) apply a biasing force to the first fluid cold plate (in this embodiment). Each electronics drawer is assumed to include a thermal dissipation assembly such as depicted in FIG. 3, with a planar main surface 334 of heat rejection cold plate 335 in physical contact with a planar main surface 341 of a system cold plate 340 when the drawer is docked. The docked drawers are assumed to be powered and cooled. Also, as shown in FIG. 4B, a monolithic system cold plate can be employed to extract heat from the heat rejection cold plates of the various drawers. Cold plate 440 includes an inlet cooling line 442 and an outlet cooling line 444 through which coolant flows to remove heat from system cold plate 440. It will be appreciated that, alternatively, the single system cold plate could be replaced in function by any number of smaller cold plates plumbed in series or parallel.

Figure 5:
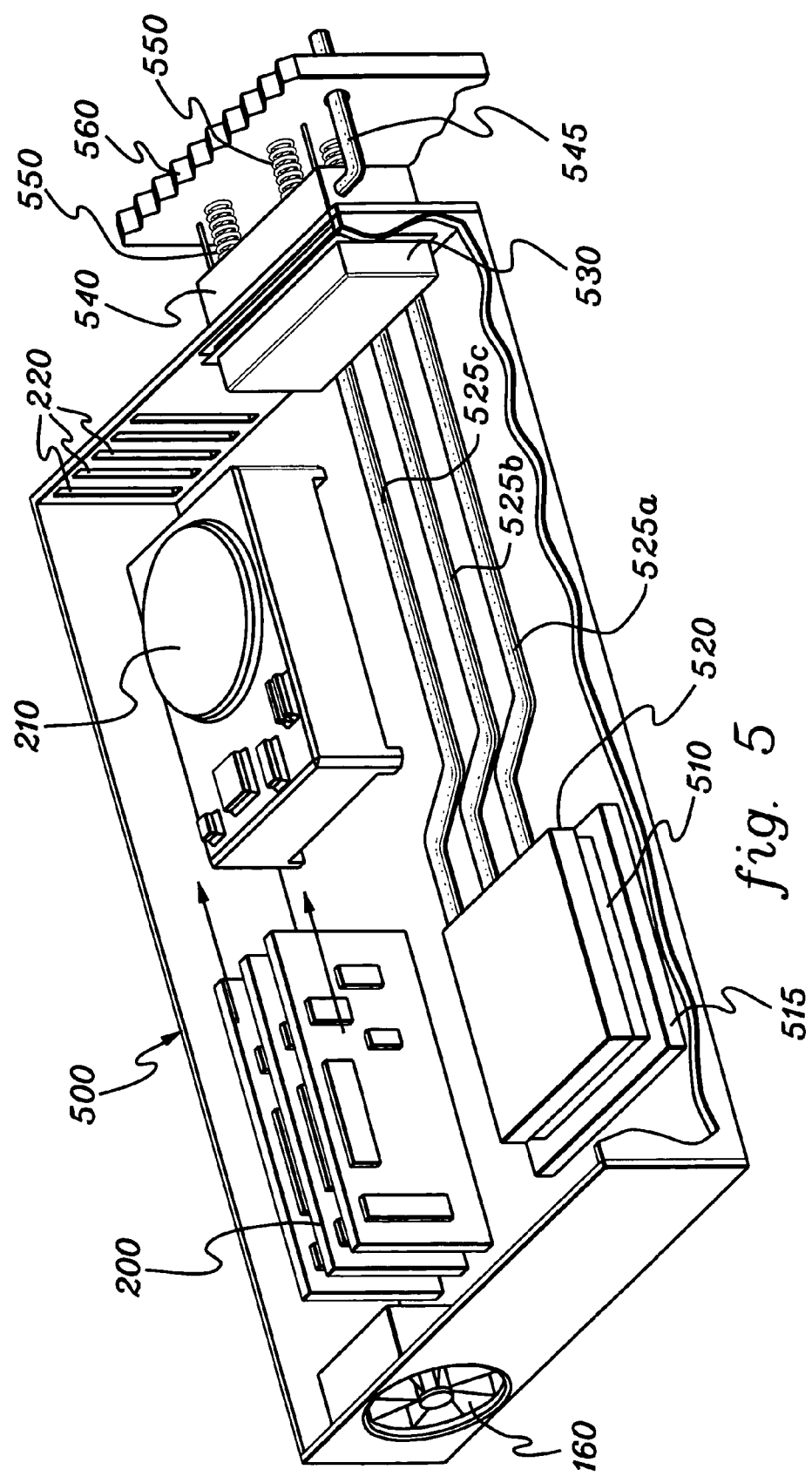
FIG. 5 is a partially cut away, perspective view of an alternate embodiment of an electronics drawer and thermal dissipation assembly, in accordance with an aspect of the present invention.

FIG. 5 depicts an alternate embodiment of a thermal dissipation assembly disposed within an electronics drawer, in accordance with an aspect of the present invention. This alternative embodiment employs a passive (i.e., no pump) primary cooling loop within the electronics drawer. As shown, a heat pipe or thermosiphon assembly is used to cool a processor module 510 disposed on a module socket 515. This assembly includes an evaporator heat transfer block 520, a first fluid cold plate 530, and multiple heat pipes 525a, 525b, 525c connecting the evaporator 520 and the first fluid cold plate 530. The evaporator heat transfer block 520 is attached to a surface of the electronics module 510. The first fluid cold plate 530 is mounted to a retention plate mechanically tied down to the drawer chassis.

A module system cold plate 540 (i.e., a "second fluid cold plate" in the appended claims) is provided for each electronics drawer in the rack and is mounted via springs 550 to a mounting plate 560 mechanically tied to the rack frame supporting the drawers. In this embodiment, the modular system cold plate 540 is allowed to project a small distance through an opening in the back of the electronics drawer when the drawer is undocked. When the drawer is docked, the first fluid cold plate 530 contacts the module system cold plate 540 and causes the springs to compress. The reaction force due to the compressed springs provides the mechanical force which ensures coplanarity between or physical engaging of the first planar heat transfer surface of the first fluid cold plate 530 and the second planar heat transfer surface of the module system cold plate 540. This ensures good thermal contact between the first fluid cold plate 530 and the module system cold plate 540. A liquid coolant line 545 is also shown in the figure, as are fan 160, electronics cards 200, hard drive 210, and air exhaust vents 220, by way of example.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A thermal dissipation assembly comprising:
   a first liquid cooling subsystem disposed substantially within an electronics drawer and positioned to extract heat from a heat generating component within the electronics drawer, said first liquid cooling subsystem including a first fluid cold plate with a first planar heat transfer surface, the first fluid cold plate being a heat rejection cold plate;
   a second liquid cooling subsystem disposed substantially external to the electronics drawer, said second liquid cooling subsystem including a second fluid cold plate with a second planar heat transfer surface;
   wherein at least one of the first fluid cold plate and the second fluid cold plate moves in a horizontal direction relative to the electronics drawer as the electronics drawer is slid horizontally into a docked position in an electronics rack, and wherein the first planar heat transfer surface of the first fluid cold plate and the second planar heat transfer surface of the second fluid cold plate are each disposed perpendicular to the sliding direction of the electronics drawer as the electronics drawer is slid into the docked position in the electronics rack; and
   a spring biasing mechanism for mechanically forcing the at least one moveable first fluid cold plate or second fluid cold plate into physical contact with the other of the first fluid cold plate and the second fluid cold plate, with the first planar heat transfer surface and the second planar heat transfer surface engaging when the electronics drawer is in the docked position in the electronics rack to facilitate the transfer of heat from the first liquid cooling subsystem to the second liquid cooling subsystem, and wherein the spring biasing mechanism compresses in the sliding direction as the electronics drawer is slid into the docked position, thereby applying a biasing force against the at least one moveable first fluid cold plate or second fluid cold plate that is perpendicular to the first planar heat transfer surface and the second planar heat transfer surface when the electronics drawer is docked.

2. The thermal dissipation assembly of claim 1, wherein the heat generating component comprises an electronics module disposed within the electronics drawer, and the first liquid cooling subsystem includes a module cold plate coupled to the electronics module and a pump for moving coolant between the module cold plate and the first cold plate to facilitate extraction of heat from the electronics module and dissipation of the heat to the second cold plate of the second liquid cooling subsystem when the electronics drawer is docked and the electronics module is operational.

3. The thermal dissipation assembly of claim 2, further comprising an L-shaped pressure plate affixed to the electronics drawer, and wherein the spring biasing mechanism is disposed between the L-shaped pressure plate and the first cold plate.

4. The thermal dissipation assembly of claim 1, wherein the first liquid cooling subsystem further comprises an evaporator heat transfer block positioned to extract heat from the heat generating component, and at least one heat pipe interconnecting the evaporator heat transfer block and the first fluid cold plate for transferring heat from the heat generating component to the first planar heat transfer surface of the first fluid cold plate.

5. The thermal dissipation assembly of claim 4, wherein the first fluid cold plate is mechanically fixed relative to the electronics drawer, and the spring biasing mechanism applies the biasing force to the second fluid cold plate when the electronics drawer is in the docked position in the electronics rack, and wherein the second fluid cold plate reciprocates relative to the sliding direction of the electronics drawer as the electronics drawer is docked in and undocked from the electronics rack.

6. A cooled multi-drawer electronics rack comprising;
   a plurality of electronics drawers, at least one electronics drawer of the plurality of electronics drawers having a thermal dissipation assembly comprising:
      a first liquid cooling subsystem disposed substantially within an electronics drawer and positioned to extract heat from a heat generating component within the electronics drawer, said first liquid cooling subsystem including a first fluid cold plate with a first planar heat transfer surface, the first fluid cold plate being a heat rejection cold plate;
      a second liquid cooling subsystem disposed substantially external to the electronics drawer, said second liquid cooling subsystem including a second fluid cold plate with a second planar heat transfer surface;
      wherein at least one of the first fluid cold plate and the second fluid cold plate moves in a horizontal direction relative to the electronics drawer as the electronics drawer is slid horizontally into a docked position in an electronics rack, and wherein the first planar heat transfer surface of the first fluid cold plate and the second planar heat transfer surface of the second fluid cold plate are each disposed perpendicular to the sliding direction of the electronics drawer as the electronics drawer is slid into the docked position in the electronics rack; and
      a spring biasing mechanism for mechanically forcing the at least one moveable first fluid cold plate or second fluid cold plate into physical contact with the other of the first fluid cold plate and the second fluid cold plate with the first planar heat transfer surface and the second planar heat transfer surface engaging when the electronics drawer is in the docked position in the electronics rack to facilitate the transfer of heat from the first liquid cooling subsystem to the second liquid cooling subsystem, and wherein the spring biasing mechanism compresses in the sliding direction as the electronics drawer is slid into the docked position, thereby applying a biasing force against the at least one moveable first fluid cold plate or second fluid cold plate that is perpendicular to the first planar heat transfer surface and the second planar heat transfer surface when the electronics drawer is docked.

7. The cooled multi-drawer electronics rack of claim 6, wherein the heat generating component comprises an electronics module disposed within the at least one electronics drawer, and the first liquid cooling subsystem includes a module cold plate coupled to the electronics module and a pump for moving coolant between the module cold plate and the first fluid cold plate to facilitate extraction of heat from the electronics module and dissipation of the heat to the second liquid cooling subsystem when the at least one electronics drawer is docked in the multi-drawer electronics rack.

8. The cooled multi-drawer electronics rack of claim 6, wherein the first liquid cooling subsystem further comprises an evaporator heat transfer block positioned to extract heat from the heat generating component, and at least one heat pipe interconnecting the evaporator heat transfer block and the first fluid cold plate for transferring heat from the heat generating component to the first planar heat transfer surface of the first fluid cold plate.

9. The cooled multi-drawer electronics rack of claim 8, wherein the first fluid cold plate is mechanically fixed relative to the at least one electronics drawer, and the spring biasing mechanism applies the biasing force to the second fluid cold plate when the at least one electronics drawer is in the docked position in the multi-drawer electronics rack, and wherein the second fluid cold plate reciprocates relative to the sliding direction of the electronics drawer as the electronics drawer is docked in and undocked from the electronics rack.

10. A method of fabricating a thermal dissipation assembly for an electronics drawer of an electronics rack, said method comprising:

providing a first liquid cooling subsystem disposed substantially within the electronics drawer and positioned to extract heat from a heat generating component of the electronics drawer, the first liquid cooling subsystem including a first fluid cold plate with a first planar heat transfer surface, the first fluid cold plate being a heat rejection cold plate;

disposing external to the electronics drawer, at least partially within the electronics rack, a second liquid cooling subsystem, the second liquid cooling subsystem including a second fluid cold plate with a second planar heat transfer surface;

wherein at least one of the first fluid cold plate and the second fluid cold plate moves in a horizontal direction relative to the electronics drawer as the electronics drawer is slid horizontally into a docked position in an electronics rack, and wherein the first planar heat transfer surface of the first fluid cold plate and the second planar heat transfer surface of the second fluid cold plate are each disposed perpendicular to the sliding direction of the electronics drawer; and spring biasing the at least one moveable first fluid cold plate or second fluid cold plate for mechanically forcing the at least one moveable first fluid cold plate or second fluid cold plate into physical contact with the other of the first fluid cold plate and the second fluid cold plate, with the first planar heat transfer surface and the second planar heat transfer surface engaging when the electronics drawer is in the docked position in the electronics rack to facilitate transfer of heat from the first liquid cooling subsystem to the second liquid cooling subsystem, and wherein the spring biasing mechanism compresses in the sliding direction as the electronics drawer is slid into the docked position, thereby applying a biasing force against the at least one moveable first fluid cold plate or second fluid cold plate that is perpendicular to the first planar heat transfer surface and the second planar heat transfer surface when the electronics drawer is docked.

11. The method of claim 10, wherein the heat generating component comprises an electronics module disposed within the electronics drawer, and the first liquid cooling subsystem includes a module cold plate coupled to the electronics module and a pump for moving coolant between the module cold plate and the first fluid cold plate to facilitate extraction of heat from the electronics module and dissipation of the heat to the second liquid cooling subsystem when the electronics drawer is docked in the electronics rack.

12. The method of claim 10, wherein the first liquid cooling subsystem further comprises an evaporator heat transfer block positioned to extract heat from the heat generating component, and at least one heat pipe interconnecting the evaporator heat transfer block and the first fluid cold plate for transferring heat from the heat generating component to the first planar heat transfer surface of the first fluid cold plate.

13. The method of claim 12, wherein the first fluid cold plate is mechanically fixed to the electronics drawer, and the spring biasing comprises providing the biasing force to the second fluid cold plate when the electronics drawer is in the docked position in the electronics rack, and wherein the second fluid cold plate reciprocates relative to the sliding direction of the electronics drawer as the electronics drawer is docked in and undocked from the electronics rack.

* * * * *

UNITED STATES PATENT AND TRADEMARK OFFICE
CERTIFICATE OF CORRECTION

PATENT NO.     : 7,012,807 B2
DATED          : March 14, 2006
INVENTOR(S)    : Chu et al.

It is certified that error appears in the above-identified patent and that said Letters Patent is hereby corrected as shown below:

Column 3,
Line 65, delete "ioop" and insert -- loop --.

Signed and Sealed this

Twenty-third Day of May, 2006

JON W. DUDAS
*Director of the United States Patent and Trademark Office*